(12) United States Patent
Komatsu et al.

(10) Patent No.: US 11,705,331 B2
(45) Date of Patent: Jul. 18, 2023

(54) METHOD AND COMPOSITION FOR SELECTIVELY MODIFYING BASE MATERIAL SURFACE

(71) Applicant: JSR CORPORATION, Tokyo (JP)

(72) Inventors: Hiroyuki Komatsu, Tokyo (JP); Tomohiro Oda, Tokyo (JP); Hitoshi Osaki, Tokyo (JP); Masafumi Hori, Tokyo (JP); Takehiko Naruoka, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 17/148,729

(22) Filed: Jan. 14, 2021

(65) Prior Publication Data

US 2021/0166935 A1 Jun. 3, 2021

Related U.S. Application Data

(60) Division of application No. 16/288,354, filed on Feb. 28, 2019, now Pat. No. 10,950,438, which is a
(Continued)

(30) Foreign Application Priority Data

Sep. 1, 2016 (JP) .................. 2016-171340

(51) Int. Cl.
*H01L 21/027* (2006.01)
*C08F 112/08* (2006.01)
(Continued)

(52) U.S. Cl.
CPC .......... *H01L 21/0271* (2013.01); *C08F 8/00* (2013.01); *C08F 112/08* (2013.01);
(Continued)

(58) Field of Classification Search
CPC .......... H01L 21/0271; H01L 21/02118; H01L 21/02282; H01L 21/02359
See application file for complete search history.

(56) References Cited

U.S. PATENT DOCUMENTS 5,585,450 A * 12/1996 Oaks ..................... C07C 247/16
526/279
6,565,763 B1 * 5/2003 Asakawa .................. C23F 1/30
216/56
(Continued)

FOREIGN PATENT DOCUMENTS

JP 2003-76036 A 3/2003
JP 2007-131875 A 5/2007
(Continued)

OTHER PUBLICATIONS

Wikipedia, The free encyclopedia, "Nitride" via https://web.archive.org/web/20160311024709/https://en.wikipedia.org/wiki/Nitrile; pp. 1-9 (Year: 2016).*
(Continued)

*Primary Examiner* — Binh X Tran
(74) *Attorney, Agent, or Firm* — Oblon, McClelland, Maier & Neustadt, L.L.P.

(57) ABSTRACT

A composition for use in selective modification of a base material surface includes a polymer having, at an end of a main chain or a side chain thereof, a group including a first functional group capable of forming a bond with a metal, and a solvent.

20 Claims, 1 Drawing Sheet

Related U.S. Application Data continuation of application No. PCT/JP2017/030427, filed on Aug. 24, 2017.

(51) Int. Cl.

| | |
|---|---|
| *C09D 125/06* | (2006.01) |
| *H01L 21/28* | (2006.01) |
| *H01L 21/321* | (2006.01) |
| *H01L 21/285* | (2006.01) |
| *C08F 8/00* | (2006.01) |
| *H01L 21/02* | (2006.01) |
| *H01L 21/311* | (2006.01) |
| *C08F 120/14* | (2006.01) |
| *C08L 25/06* | (2006.01) |
| *C08L 33/10* | (2006.01) |

(52) U.S. Cl.
CPC ...... *C09D 125/06* (2013.01); *H01L 21/02118* (2013.01); *H01L 21/02282* (2013.01); *H01L 21/02334* (2013.01); *H01L 21/02359* (2013.01); *H01L 21/28* (2013.01); *H01L 21/285* (2013.01); *H01L 21/31133* (2013.01); *H01L 21/321* (2013.01); *C08F 120/14* (2013.01); *C08F 2810/40* (2013.01); *C08L 25/06* (2013.01); *C08L 33/10* (2013.01); *C08L 2203/206* (2013.01); *C08L 2312/02* (2013.01)

(56) References Cited

U.S. PATENT DOCUMENTS

| | | | | |
|---|---|---|---|---|
| 2008/0118728 | A1* | 5/2008 | Magley | B29B 15/12 427/372.2 |
| 2009/0269606 | A1* | 10/2009 | Matsumoto | C23C 18/1653 428/553 |
| 2013/0078576 | A1* | 3/2013 | Wu | C08F 293/00 430/296 |
| 2016/0168422 | A1* | 6/2016 | Iwai | B32B 27/06 428/339 |
| 2017/0113249 | A1* | 4/2017 | Viel | B05D 7/24 |
| 2018/0179374 | A1* | 6/2018 | Noguchi | C08F 292/00 |
| 2019/0194365 | A1* | 6/2019 | Komatsu | C08F 212/20 |

FOREIGN PATENT DOCUMENTS

| | | |
|---|---|---|
| JP | 2007-202489 A | 8/2007 |
| JP | 2010-84196 A | 4/2010 |
| JP | 2012-36078 A | 2/2012 |
| JP | 2016-25355 A | 2/2016 |

OTHER PUBLICATIONS

Wikipedia, The free encyclopedia, "Cyanate" via https://web.archive.org/web/20160310232615/https://en.wikipedia.org/wiki/Cyanate pp. 1-4 (Year: 2016).*

Wikipedia "Azobisisobutyronitrile" via https://web.archive.org/web/20160414151303/https://en.wikipedia.org/wiki/Azobisisobutyronitrile; pp. 1-3 (Year: 2015).*

Sigma-Aldrich, "Product Name 4-vinylbenzocyclobutene" via https://www.sigmaaldrich.com/specification-sheets/120/028/733377-BULK_ALDRICH_.pdf; p. 1; No date available.*

Japanese Office Action dated Feb. 2, 2021 in Japanese Patent Application No. 2018-537211 (with English translation), citing documents AO-AP therein, 8 pages.

International Search Report dated Nov. 7, 2017 in PCT/JP2017/030427 (with English translation), citing document AO therein, 5 pages.

Written Opinion of the International Searching Authority dated Nov. 7, 2017 in PCT/JP2017/030427 (with English translation), citing document AO therein, 7 pages.

Hashemi, F.S.M., et al., "Self-Correcting Process for High Quality Patterning by Atomic Layer Deposition", ACS Nano, vol. 9 No. 9, 2015, pp. 8710-8717.

Fang, M., et al., "Area-Selective Atomic Layer Deposition: Conformal Coating, Subnanometer Thickness Control, and Smart Positioning", ACS Nano, vol. 9 No. 9, 2015, pp. 8651-8654.

Lee, H., et al., "Mussel-Inspired Surface Chemistry for Multifunctional Coatings", Science, vol. 318, Oct. 19, 2007, pp. 426-430 (10pages).

Hozumi, A., et al., "Preparation of a Well-Defined Amino-Terminated Self-Assembled Monolayer and Copper Microlines on a Polyimide Substrate Covered with an Oxide Nanoskln", Langmuir, vol. 21 No. 18, 2005, pp. 8234-8242.

Office Action dated Feb. 15, 2022 in corresponding Japanese Patent Application No. 2021-074383 (with English Translation), 6 pages.

Office Action dated May 16, 2023 in corresponding Japanese Patent Application No. 2022-121387 (with Machine-generated English translation) citing Document 15, 6 pages.

\* cited by examiner

METHOD AND COMPOSITION FOR SELECTIVELY MODIFYING BASE MATERIAL SURFACE

CROSS-REFERENCE TO RELATED APPLICATIONS

The present application is a divisional application of and claims the benefit of priority to U.S. application Ser. No. 16/288,354, filed Feb. 28, 2019, which is a continuation application of International Application No. PCT/JP2017/030427, filed Aug. 24, 2017, which claims the benefit of priority to Japanese Patent Application No. 2016-171340, filed Sep. 1, 2016. The entire contents of all of the above applications are incorporated herein by reference.

BACKGROUND OF THE INVENTION

Field of the Invention

The present invention relates to a method for selectivity modifying a base material surface, and to a composition.

DISCUSSION OF THE BACKGROUND

Further miniaturization of semiconductor devices has been accompanied by a demand for a technique of forming a fine pattern having a line width of less than 30 nm. However, it is technically difficult to meet such a demand by conventional methods employing lithography, due to optical factors and the like.

To this end, a bottom-up technique, as generally referred to, has been contemplated for forming a fine pattern. As the bottom-up technique, in addition to a method employing directed self-assembly of a polymer, a method for selectively modifying a base material having a surface layer that includes fine regions has been recently studied. The method for selectivity modifying the substrate requires a material enabling easy and highly selective modification of surface regions, and various materials have been investigated for such use (see Japanese Unexamined Patent Application, Publication No. 2016-25355; Japanese Unexamined Patent Application, Publication No. 2003-76036; ACS Nano, 9, 9, 8710, 2015; ACS Nano, 9, 9, 8651, 2015; Science, 318, 426, 2007; and Langmuir, 21, 8234, 2005).

The aforementioned conventional materials are low-molecular materials and therefore are unsuitable for application by spin coating in preexisting processes and requiring a Langmuir-Blodgett method.

SUMMARY OF THE INVENTION

According to an aspect of the present invention, a method for selectively modifying a base material surface, includes applying a composition on a surface of a base material to form a coating film. The coating film is heated. The base material includes a surface layer which includes a first region including a metal. The composition includes a first polymer and a solvent. The first polymer includes at an end of a main chain or a side chain thereof, a group including a first functional group capable of forming a bond with the metal.

According to another aspect of the present invention, a composition for use in selective modification of a base material surface, includes a polymer and a solvent. The polymer includes at an end of a main chain or a side chain thereof, a group including a first functional group capable of forming a bond with a metal.

DESCRIPTION OF EMBODIMENTS

Figure 1:
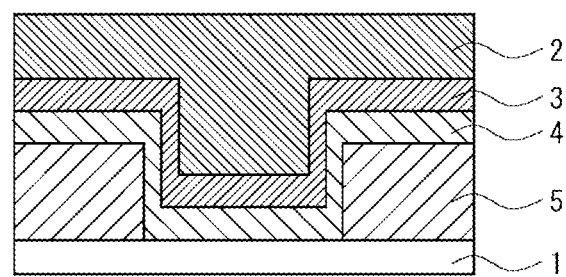
FIG. 1 is a cross sectional view illustrating a substrate for use in producing a striped substrate.

According to an embodiment of the invention, a method for selectively modifying a base material surface comprises: providing a base material comprising a surface layer which comprises a first region comprising a metal; applying a composition on a surface of the base material to form a coating film, the composition comprising: a first polymer comprising at an end of a main chain or a side chain, a group comprising a first functional group capable of forming a bond with the metal; and a solvent; and heating the coating film.

According to another embodiment of the invention, a composition for use in selective modification of a base material surface comprises: a polymer comprising at an end of a main chain or a side chain, a group comprising a first functional group capable of forming a bond with a metal; and a solvent.

The method for selectively modifying a base material surface and the composition for use in selective modification of a base material surface of the embodiments of the present invention enable easy, highly selective and dense modification of surface regions containing a metal. Therefore, the method for selectively modifying a base material surface and the composition can be suitably used for working processes of semiconductor devices, and the like, in which microfabrication is expected to be further in progress hereafter.

Hereinafter, embodiments of the method for selectively modifying a base material surface (hereinafter, may be merely referred to as "selective modification method") will be described in detail below.

Selective Modification Method

The selective modification method of the embodiment of the invention includes: a step of providing a base material having a surface layer which includes a first region (hereinafter, may be also referred to as "region (I)") containing a metal (hereinafter, may be also referred to as "metal (A)") (hereinafter, may be also referred to as "providing step"); a step of applying a composition (hereinafter, may be also referred to as "composition (I)") on a surface of the base material to form a coating film, the composition containing: a first polymer (hereinafter, may be also referred to as "(A) polymer" or "polymer (A)") having at an end of a main chain or a side chain, a group (hereinafter, may be also referred to as "group (I)") containing a first functional group (hereinafter, may be also referred to as "functional group (A)") capable of forming a bond with the metal (A); and a solvent (hereinafter, may be also referred to as "(B) solvent" or "solvent (B)") (hereinafter, may be also referred to as "applying step"); and a step of heating the coating film (hereinafter, may be also referred to as "heating step"). In the selective modification method, it is preferred that: the base material further includes a second region (hereinafter, may be also referred to as "region (II)") containing substantially only a non-metal; and the method further includes, after the heating step, a step of removing with a rinse agent a portion of the coating film, the portion being formed on the region (II)(hereinafter, may be also referred to as "removing step").

The selective modification method may further include, for example:

a step of bringing an alcohol, a dilute acid, ozone or plasma into contact with the surface of the base material after the removing step (hereinafter, may be also referred to as "contacting step"); a step of depositing a pattern on the surface of the base material after the removing step, with a CVD method or an ALD method (hereinafter, may be also referred to as "depositing step"); a step of etching away the polymer (A) from the surface of the base material after the removing step (hereinafter, may be also referred to as "etching step"); and the like. Hereinafter, each step is explained.

Providing Step

In this step, the base material having a surface layer which includes the region (I) containing the metal (A) is provided.

The metal (A) is not particularly limited as long as it is a metal element. It is to be noted that silicon is a non-metal and does not fall under the definition of metal. Examples of the metal (A) include copper, iron, zinc, cobalt, aluminum, tin, tungsten, zirconium, titanium, tantalum, germanium, molybdenum, ruthenium, gold, silver, platinum, palladium, nickel, and the like. Of these, copper, cobalt, tungsten, and tantalum are preferred.

The form of the metal (A) contained in the region (I) is exemplified by a metal simple substance, an alloy, a conductive nitride, a metal oxide, a silicide, and the like.

Examples of the metal simple substance include simple substances of metals such as copper, iron, cobalt, tungsten and tantalum, and the like.

Examples of the alloy include a nickel-copper alloy, a cobalt-nickel alloy, a gold-silver alloy, and the like.

Examples of the conductive nitride include titanium nitride, titanium nitride, iron nitride, aluminum nitride and the like.

Examples of the metal oxide include tantalum oxide, aluminum oxide, iron oxide, copper oxide and the like.

Examples of the silicide include iron silicide, molybdenum silicide, and the like. Of these, the metal simple substance, the alloy, the conductive nitride and the silicide are preferred; the metal simple substance and the conductive nitride are more preferred; and a copper simple substance, a cobalt simple substance, a tungsten simple substance, a tantalum simple substance and tantalum nitride are still more preferred.

The base material typically has a surface layer which includes a region (II) that is other than the region (I) and that contains substantially only a non-metal.

The form of the non-metal (B) contained in the region (II) is exemplified by a non-metal simple substance, a non-metal oxide, a non-metal nitride, a non-metal oxynitride, and the like.

Examples of the non-metal simple substance include simple substances of silicon and carbon, and the like.

Examples of the non-metal oxide include silicon oxide and the like.

Examples of the non-metal nitride include $SiN_x$, $Si_3N_4$ and the like.

Examples of the non-metal oxynitride include SiON and the like. Of these, the non-metal oxide is preferred, and silicon oxide is more preferred.

A mode of the arrangement of the region (I) and/or the region (II) on the surface layer of the base material is not particularly limited, and is exemplified by surficial, spotted, striped, and the like in a planar view. The size of the region (I) and the region (II) is not particularly limited, and may be an appropriately desired size.

The shape of the base material is not particularly limited, and may be an appropriately desired shape such as platy (substrate), spherical, and the like.

Applying Step

In this step, the composition (I) is applied on the surface of the base material.

The applying procedure of the composition (I) is exemplified by spin coating and the like.

Composition (I)

The composition (I) contains the polymer (A) and the solvent (B). The composition (I) may also contain other component(s) in addition to the polymer (A) and the solvent (B).

(A) Polymer

The polymer (A) has the group (I) at an end of a main chain or a side chain. The "main chain" as referred to means the longest one of the atom chains of a polymer. The "side chain" as referred to means an atom chain of a polymer other than the main chain. Of these, in light of further increasing the density of the polymer (A) that modifies the surface, the polymer (A) has the group (I) preferably at an end of the main chain, and more preferably at one end of the main chain.

The group (I) contains the functional group (A) capable of forming a bond with the metal (A). The functional group (A) forms a bond with the metal (A). The bond is, for example, a chemical bond, a covalent bond, an ionic bond, a coordinate bond or the like. Of these, from the perspective that a stronger bond between the metal and the functional group is formed, the coordinate bond is preferred.

The functional group (A) is exemplified by a functional group that forms a coordinate bond or the like with the metal (A), and the like, and examples of the functional group (A) include a cyano group, a sulfanyl group, an ethylenic carbon-carbon double bond-containing group, an oxazoline ring-containing group, a phosphoric acid group, an epoxy group, a disulfide group, and the like.

Examples of the polymer (A) include polymers having a structural unit derived from substituted or unsubstituted styrene, a structural unit derived from (meth)acrylic acid or a (meth)acrylic acid ester, a structural unit derived from substituted or unsubstituted ethylene, and the like. Also, the polymer (A) may have a structural unit containing a crosslinkable group. The polymer (A) may have one type or two or more types of each of: the structural unit derived from substituted or unsubstituted styrene, the structural unit derived from (meth)acrylic acid or a (meth)acrylic acid ester, the structural unit derived from substituted or unsubstituted ethylene, and/or the structural unit containing a crosslinkable group, and the like. It is to be noted that the "crosslinkable group" as referred to means a group that forms a cross-linked structure through a reaction under a heating condition, an active energy ray-irradiating condition, an acidic condition, and the like.

Examples of a monomer that gives the structural unit derived from substituted or unsubstituted styrene include styrene, α-methylstyrene, o-, m- or p-methylstyrene, p-t-butylstyrene, 2,4,6-trimethylstyrene, p-methoxystyrene, p-t-butoxystyrene, o-, m- or p-vinylstyrene, o-, m- or p-hydroxystyrene, m- or p-chloromethylstyrene, p-chlorostyrene, p-bromostyrene, p-iodostyrene, p-nitrostyrene, p-cyanostyrene, and the like.

Examples of a monomer that gives the structural unit derived from a (meth)acrylic acid ester include:

(meth)acrylic acid alkyl esters such as methyl (meth)acrylate, ethyl (meth)acrylate, t-butyl (meth)acrylate and 2-ethylhexyl (meth)acrylate;

(meth)acrylic acid cycloalkyl esters such as cyclopentyl (meth)acrylate, cyclohexyl (meth)acrylate, 1-methylcyclopentyl (meth)acrylate, 2-ethyladamantyl (meth)acrylate and 2-(adamantan-1-yl)propyl (meth)acrylate;

(meth)acrylic acid aryl esters such as phenyl (meth)acrylate and naphthyl (meth)acrylate;

(meth)acrylic acid substituted alkyl esters such as 2-hydroxyethyl (meth)acrylate, 3-hydroxyadamantyl (meth)acrylate, 3-glycidylpropyl (meth)acrylate and 3-trimethylsilylpropyl (meth)acrylate; and the like.

Examples of a monomer that gives the structural unit derived from substituted or unsubstituted ethylene include:

ethylene;

alkenes such as propene, butene and pentene;

vinylcycloalkanes such as vinylcyclopentane and vinylcyclohexane;

cycloalkenes such as cyclopentene and cyclohexene;

4-hydroxy-1-butene, vinyl glycidyl ether, vinyl trimethylsilyl ether, and the like.

The lower limit of the proportion of the monomer that gives the structural unit derived from substituted or unsubstituted styrene, the structural unit derived from a (meth)acrylic acid ester, or the structural unit derived from substituted or unsubstituted ethylene, contained with respect to the total structural units constituting the polymer (A), is preferably 20 mol %, more preferably 40 mol %, and still more preferably 60 mol %. The upper limit of the proportion of the monomer may be 100 mol %, may be preferably 90 mol %, and may be more preferably 85 mol %.

Examples of the crosslinkable group include:

polymerizable carbon-carbon double bond-containing groups such as a vinyl group, a vinyloxy group, an allyl group, a (meth)acryloyl group and a styryl group;

polymerizable carbon-carbon triple bond-containing groups such as an ethynyl group, a propargyl group, a propargyloxy group and a propargylamino group;

cyclic ether groups such as an oxiranyl group, an oxiranyloxy group, an oxetanyl group and an oxetanyloxy group;

aryl groups to which a cyclobutane ring is each fused, such as a phenyl group to which a cyclobutane ring is fused, and a naphthyl group to which a cyclobutane ring is fused;

aryl groups to which a phenolic hydroxyl group protected by an acid group or a thermally labile group each bonds, such as an acetoxyphenyl group and a t-butoxyphenyl group;

aryl groups to which a methylol group (—CH$_2$OH) protected by an acid group or a thermally labile group each bonds, such as an acetoxymethyl group and a methoxymethylphenyl group;

aryl groups to which a substituted or unsubstituted sulfanylmethyl group (—CH$_2$SH) each bonds, such as a sulfanylmethylphenyl group and a methylsulfanylmethylphenyl group; and the like.

Two aryl groups to which a cyclobutane ring is each fused form a covalent bond under the heating condition.

The "acid group" as referred to means a group that is obtained by removing —OH from an acid and that protests a phenolic hydroxyl group or a methylol group through substituting a hydrogen atom. The "thermally labile group" as referred to means a group that substitute a hydrogen atom in a phenolic hydroxyl group, a methylol group or a sulfanylmethyl group, and dissociates under heating.

In regard to the aryl group to which the protected phenolic hydroxyl group, the protected methylol group or the sulfanylmethyl group bonds, the acid group therein is exemplified by a formyl group, an acetyl group, a propionyl group, a butyryl group, a benzoyl group, and the like.

In regard to the aryl group to which the protected phenolic hydroxyl group bonds, the thermally labile group therein is exemplified by tertiary alkyl groups such as a t-butyl group and a t-amyl group, and the like. In regard to the aryl group to which the protected methylol group or the sulfanylmethyl group bonds, the thermally labile group therein is exemplified by alkyl groups such as a methyl group, an ethyl group and a propyl group, and the like.

Of these, the crosslinkable group is preferably the polymerizable carbon-carbon double bond-containing group or the aryl group to which the cyclobutane ring is fused, and more preferably the allyl group or the phenyl group to which the cyclobutane ring is fused.

The structural unit having the crosslinkable group is exemplified by a structural unit derived from a vinyl compound having the crosslinkable group, a structural unit derived from a (meth)acrylic compound having the crosslinkable group, and the like.

The structural unit having the crosslinkable group is preferably a structural unit derived from a (meth)acrylic compound having the polymerizable carbon-carbon double bond-containing group, or a structural unit derived from a vinyl compound having an aryl group to which a cyclobutane ring is fused, and more preferably a structural unit derived from allylstyrene and a structural unit derived from 4-vinylbenzocyclobutene.

When the polymer (A) includes a structural unit having the crosslinkable group, the lower limit of the proportion of the structural unit having the crosslinkable group contained with respect to the total structural units constituting the polymer (A) is preferably 0.1 mol %, more preferably 1 mol %, still more preferably 3 mol %, and particularly preferably 4 mol %. The upper limit of the proportion of the structural unit having the crosslinkable group is preferably 20 mol %, more preferably 15 mol %, still more preferably 10 mol %, and particularly preferably 8 mol %.

The polymer (A) is: preferably a polymer having the structural unit derived from substituted or unsubstituted styrene, the structural unit derived from (meth)acrylic acid or a (meth)acrylic acid ester, and/or the structural unit containing a crosslinkable group; more preferably a polymer having the structural unit derived from substituted or unsubstituted styrene, a polymer having the structural unit derived from (meth)acrylic acid ester, or a polymer having the structural unit derived from substituted or unsubstituted styrene and a structural unit containing the crosslinkable group; still more preferably a polymer having the structural unit derived from substituted or unsubstituted styrene, a polymer having the structural unit derived from (meth)acrylic acid ester, or a polymer having the structural unit derived from substituted or unsubstituted styrene and a repeating unit derived from the vinyl compound having an aryl group to which a cyclobutane ring is fused; and yet still more preferably polystyrene, poly t-butyl styrene, methyl polymethacrylate, or styrene-4-vinylbenzocyclobutene copolymer.

The lower limit of the number average molecular weight (Mn) of the polymer (A) is preferably 500, more preferably 2,000, still more preferably 4,000, and particularly preferably 5,000. The upper limit of the Mn is preferably 50,000, more preferably 30,000, still more preferably 15,000, and particularly preferably 8,000.

The upper limit of the ratio (Mw/Mn, dispersity index) of the weight average molecular weight (Mw) to the Mn of the polymer (A) is preferably 5, more preferably 2, still more preferably 1.5, and particularly preferably 1.3. The lower limit of the Mw/Mn ratio is typically 1, and preferably 1.05.

The lower limit of the content of the polymer (A) in the composition (I) with respect to the total solid content is preferably 80% by mass, more preferably 90% by mass, and still more preferably 95% by mass. The upper limit of the content is, for example, 100% by mass. The "total solid content" as referred to means the sum of the components other than the solvent (B).

(B) Solvent

The solvent (B) is not particularly limited as long as it is a solvent capable of dissolving or dispersing at least the polymer (A) and other component(s).

The solvent (B) is exemplified by an alcohol solvent, an ether solvent, a ketone solvent, an amide solvent, an ester solvent, a hydrocarbon solvent, and the like.

Examples of the alcohol solvent include:

aliphatic monohydric alcohol solvents having 1 to 18 carbon atoms such as 4-methyl-2-pentanol and n-hexanol;

alicyclic monohydric alcohol solvents having 3 to 18 carbon atoms such as cyclohexanol;

polyhydric alcohol solvents having 2 to 18 carbon atoms such as 1,2-propylene glycol;

polyhydric alcohol partial ether solvents having 3 to 19 carbon atoms such as propylene glycol monomethyl ether; and the like.

Examples of the ether solvent include:

dialkyl ether solvents such as diethyl ether, dipropyl ether, dibutyl ether, dipentyl ether, diisoamyl ether, dihexyl ether and diheptyl ether;

cyclic ether solvents such as tetrahydrofuran and tetrahydropyran;

aromatic ring-containing ether solvents such as diphenyl ether and anisole (methyl phenyl ether); and the like.

Examples of the ketone solvent include:

chain ketone solvents such as acetone, methyl ethyl ketone, methyl-n-propyl ketone, methyl n-butyl ketone, diethyl ketone, methyl iso-butyl ketone, 2-heptanone (methyl n-pentylketone), ethyl n-butyl ketone, methyl-n-hexyl ketone, di-iso-butyl ketone and trimethylnonanone;

cyclic ketone solvents such as cyclopentanone, cyclohexanone, cycloheptanone, cyclooctanone and methylcyclohexanone;

2,4-pentanedione, acetonylacetone, and acetophenone; and the like.

Examples of the amide solvent include:

cyclic amide solvents such as N,N'-dimethylimidazolidinone and N-methylpyrrolidone;

chain amide solvents such as N-methylformamide, N,N-dimethylformamide, N,N-diethylformamide, acetamide, N-methylacetamide, N,N-dimethylacetamide and N-methylpropionamide; and the like.

Examples of the ester solvent include:

monocarboxylic acid ester solvents such as n-butyl acetate and ethyl lactate;

polyhydric alcohol carboxylate solvents such as propylene glycol acetate;

polyhydric alcohol partial ether carboxylate solvents such as propylene glycol monomethyl ether acetate;

lactone solvents such as γ-butyrolactone and δ-valerolactone;

polyhydric carboxylic acid diester solvents such as diethyl oxalate;

carbonate solvents such as dimethyl carbonate, diethyl carbonate, ethylene carbonate and propylene carbonate; and the like.

Examples of the hydrocarbon solvent include:

aliphatic hydrocarbon solvents having 5 to 12 carbon atoms such as n-pentane and n-hexane;

aromatic hydrocarbon solvents having 6 to 16 carbon atoms such as toluene and xylene; and the like.

Of these, the ester solvent is preferred, the polyhydric alcohol partially etherated carboxylate solvent is more preferred, and propylene glycol monomethyl ether acetate is still more preferred. The composition (I) may contain one type of the solvent (B), or two or more types thereof.

Other Component

The composition (I) may also contain other component(s) in addition to the polymer (A) and the solvent (B). The other component(s) is/are exemplified by a surfactant and the like. When the composition (I) contains the surfactant, the coating characteristics onto the base material surface may be improved.

Preparation Method of Composition (I)

The composition (I) may be prepared by, for example, mixing the polymer (A), the solvent (B), and as needed the other component(s) at a predetermined ratio, and preferably filtering the resulting mixture through a high-density polyethylene filter with fine pores of about 0.45 μm, etc. The lower limit of the solid content concentration of the composition (I) is preferably 0.1% by mass, more preferably 0.5% by mass, and still more preferably 0.7% by mass. The upper limit of the solid content concentration is preferably 30% by mass, more preferably 10% by mass, and still more preferably 3% by mass.

Heating Step

In this step, the coating film formed by the applying step is heated. Accordingly, formation of the bond between the metal (A) on the substrate layer of the base material and the functional group (A) in the polymer (A) of the composition (I) is accelerated, whereby a coating film (hereinafter, may be also referred to as "coating film (I)") containing the polymer (A) is overlaid on the region (I) of the base material surface.

Means for heating may be, for example, an oven, a hot plate, and the like. The lower limit of the temperature for the heating is preferably 80° C., more preferably 100° C., and still more preferably 130° C. The upper limit of the temperature for the heating is preferably 400° C., more preferably 300° C., and still more preferably 200° C. The lower limit of the time period of the heating is preferably 10 sec, more preferably 1 min, and still more preferably 2 min. The upper limit of the time period of the heating is preferably 120 min, more preferably 10 min, and still more preferably 5 min.

The average thickness of the coating film (I) formed can be adjusted to a desired value through appropriately selecting the type and concentration of the polymer (A) in the composition (I), and conditions in the heating step such as the heating temperature and the heating time period. The lower limit of the average thickness of the coating film (I) is preferably 0.1 nm, more preferably 1 nm, and still more preferably 3 nm. The upper limit of the average thickness is, for example, 20 nm.

Removing Step

In this step, a portion of the coating film (I) is removed, the portion being formed on the region (II). Accordingly, a portion containing the polymer (A) not bonded to the metal (A) after the heating step is removed, whereby a base material having the region (I) being selectively modified is obtained.

The removing in the removing step is carried out typically by rinsing the base material after the heating step with a rinse agent. The rinse agent used is typically an organic solvent, and for example, a polyhydric alcohol partially etherated carboxylate solvent such as propylene glycol monomethyl ether acetate, a monohydric alcohol solvent such as isopropanol, or the like may be used.

The aforementioned process enables easy, highly selective and dense modification of surface regions containing a metal. The base material thus obtained may be processed in various ways by carrying out the following steps, for example.

Contacting Step

In this step, an alcohol, a dilute acid, a hydrogen peroxide solution, ozone or plasma is brought into contact with the surface of the base material after the removing step. Accordingly, an air-oxidized film layer formed on the region (II) is enabled to be removed. The dilute acid is not particularly limited, and examples of the dilute acid include dilute hydrochloric acid, dilute sulfuric acid, dilute nitric acid, dilute citric acid, dilute oxalic acid, dilute maleic acid, dilute acetic acid, dilute isobutyric acid, dilute 2-ethylhexanoic acid, and the like.

Depositing Step

In this step, a pattern is deposited on the surface of the base material after the removing step, with a CVD (chemical vapor deposition) method or an ALD (atomic layer deposition) method. Accordingly, a pattern may be selectively formed on the region (II) not covered with the polymer (A).

Etching Step

In this step, the polymer (A) on the surface of the base material after the removing step is etched away.

The etching procedure is exemplified by well-known techniques including: reactive ion etching (ME) such as chemical dry etching carried out using $CF_4$, an $O_2$ gas or the like by utilizing the difference in etching rate of each layer, etc., as well as chemical wet etching (wet development) carried out by using an etching liquid such as an organic solvent or hydrofluoric acid; physical etching such as sputtering etching and ion beam etching. Of these, the reactive ion etching is preferred, and the chemical dry etching and the chemical wet etching are more preferred.

Prior to the chemical dry etching, an irradiation with a radioactive ray may be also carried out as needed. As the radioactive ray, when the portion to be etched away is a polymer including a methyl polymethacrylate block, a UV irradiation or the like may be used. An oxygen plasma treatment may also be used. The UV irradiation or the oxygen plasma treatment results in degradation of the methyl polymethacrylate block, whereby the etching is facilitated.

Examples of the organic solvent for use in the chemical wet etching include:

alkanes such as n-pentane, n-hexane and n-heptane;

cycloalkanes such as cyclohexane, cycloheptane and cyclooctane;

saturated carboxylic acid esters such as ethyl acetate, n-butyl acetate, i-butyl acetate and methyl propionate;

ketones such as acetone, methyl ethyl ketone, methyl isobutyl ketone and methyl n-pentyl ketone;

alcohols such as methanol, ethanol, 1-propanol, 2-propanol and 4-methyl-2-pentanol; and the like. These solvents may be used either alone, or two or more types thereof may be used in combination.

EXAMPLES

Hereinafter, the present invention is explained in detail by way of Examples, but the present invention is not limited to these Examples. Measuring methods for physical properties are shown below.

Mw and Mn

The Mw and the Mn of the polymer were determined by gel permeation chromatography (GPC) using GPC columns (Tosoh Corporation; "G2000 HXL"×2, "G3000 HXL"×1 and "G4000 HXL"×1) under the following conditions:

eluent: tetrahydrofuran (Wako Pure Chemical Industries, Ltd.);

flow rate: 1.0 mL/min;

sample concentration: 1.0% by mass;

amount of sample injected: 100 μL;

column temperature: 40° C.;

detector: differential refractometer; and standard substance: mono-dispersed polystyrene.

$^{13}$C-NMR Analysis $^{13}$C-NMR analysis was carried out using a nuclear magnetic resonance apparatus ("JNM-EX400" available from JEOL, Ltd.), with $CDCl_3$ for use as a solvent for measurement. The proportion of each structural unit in the polymer was calculated from an area ratio of a peak corresponding to each structural unit on the spectrum obtained by the $^{13}$C-NMR.

Synthesis of Polymer (A)

Synthesis Example 1

After a 500 mL three-neck flask as a reaction vessel was dried under reduced pressure, 120 g of THF which had been subjected to a distillation dehydrating treatment in a nitrogen atmosphere was charged, and cooled to −78° C. Thereafter, 2.38 mL of a 1 N cyclohexane solution of sec-butyllithium (sec-BuLi) (2.31 mmol) was charged into this THF, and then 13.3 mL of styrene (0.115 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 30 min. Next, 1 mL of methanol as a chain-end terminator was charged to conduct a terminating reaction of the polymerization end. The temperature of the reaction solution was elevated to the room temperature, and the reaction solution was concentrated. Thereafter, the solvent was substituted with methyl isobutyl ketone (MIBK). Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 11.7 g of a white polymer (A-1). The polymer (A-1) had the Mw of 5,600, the Mn of 5,300, and the Mw/Mn of 1.06.

Synthesis Example 2

After a 500 mL three-neck flask as a reaction vessel was dried under reduced pressure, 120 g of THF which had been subjected to a distillation dehydrating treatment in a nitrogen atmosphere was charged, and cooled to −78° C. Thereafter, 2.38 mL of a 1 N cyclohexane solution of sec-butyllithium (sec-BuLi) (2.30 mmol) was charged into this THF, and then 13.3 mL of styrene (0.115 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 30 min. Next, 0.32 mL of 4-chloromethyl-2,2-dimethyl-1,3-dioxolane (2.30 mmol) as a chain-end terminator was charged to conduct a terminating reaction of the polymerization end. Subsequently, 10 g of a 1 N aqueous hydrochloric acid solution was added thereto, and the mixture thus obtained was stirred under heating at 60° C. for 2 hrs and then subjected to a hydrolysis reaction, to give a polymer having a diol structure as a terminal group. The reaction solution was cooled to the room temperature, and the reaction solution was concentrated. Thereafter, the solvent was substituted with MIBK. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 11.3 g of a white polymer (A-2). The polymer (A-2) had the Mw of 5,300, the Mn of 4,900, and the Mw/Mn of 1.08.

Synthesis Example 3

After a 500 mL three-neck flask as a reaction vessel was dried under reduced pressure, 120 g of tetrahydrofuran which had been subjected to a distillation dehydrating treatment in a nitrogen atmosphere was charged, and cooled to −78° C. Thereafter, 2.38 mL of a 1 N cyclohexane solution of sec-butyllithium (sec-BuLi) (2.30 mmol) was charged into this tetrahydrofuran, and then 13.3 mL of styrene (0.115 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 30 min. Next, 0.19 mL of 3-bromopropionitrile (2.30 mmol) was charged to conduct a terminating reaction of the polymerization end. The temperature of the reaction solution was elevated to the room temperature, and the reaction solution was concentrated. Thereafter, the solvent was substituted with methyl isobutyl ketone (MIBK). Thereafter, 1,000 g of a 2% by mass aqueous oxalic acid solution was charged and the mixture was stirred. After leaving to stand, the aqueous underlayer was removed. This operation was repeated three times to remove metallic Li. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 11.9 g of a white polymer (A-3). The block copolymer (A-3) had the Mw of 5,600, the Mn of 5,200, and the Mw/Mn of 1.08.

Synthesis Example 4

After a 500 mL three-neck flask as a reaction vessel was dried under reduced pressure, 120 g of tetrahydrofuran which had been subjected to a distillation dehydrating treatment in a nitrogen atmosphere was charged, and cooled to −78° C. Thereafter, 2.38 mL of a 1 N cyclohexane solution of sec-butyllithium (sec-BuLi) (2.30 mmol) was charged into this tetrahydrofuran, and then 13.3 mL of styrene (0.115 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 30 min. Next, 0.20 mL of allyl bromide (2.30 mmol) was charged to conduct a terminating reaction of the polymerization end. The temperature of the reaction solution was elevated to the room temperature, and the reaction solution was concentrated. Thereafter, the methyl solvent was substituted with isobutyl ketone (MIBK). Thereafter, 1,000 g of a 2% by mass aqueous oxalic acid solution was charged and the mixture was stirred. After leaving to stand, the aqueous underlayer was removed. This operation was repeated three times to remove metallic Li. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 11.4 g of a white polymer (A-4). The polymer (A-4) had the Mw of 5,700, the Mn of 5,200, and the Mw/Mn of 1.10.

Synthesis Example 5

After a 500 mL three-neck flask as a reaction vessel was dried under reduced pressure, 120 g of tetrahydrofuran which had been subjected to a distillation dehydrating treatment in a nitrogen atmosphere was charged, and cooled to −78° C. Thereafter, 2.38 mL of a 1 N cyclohexane solution of sec-butyllithium (sec-BuLi) (2.31 mmol) was charged into this tetrahydrofuran, and then 13.3 mL of styrene (0.115 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 30 min. Next, as a chain-end terminator, 0.14 mL of ethylene sulfide (2.31 mmol), 1 mL of methanol and 0.3 g of p-methoxyphenol were added to conduct a terminating reaction of the polymerization end. The temperature of the reaction solution was elevated to the room temperature, and the reaction solution was concentrated. Thereafter, the solvent was substituted with methyl isobutyl ketone (MIBK). Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 11.0 g of a white polymer (A-5). The polymer (A-5) had the Mw of 5,300, the Mn of 5,100, and the Mw/Mn of 1.04.

Synthesis Example 6

After a 500 mL three-neck flask as a reaction vessel was dried under reduced pressure, 120 g of tetrahydrofuran which had been subjected to a distillation dehydrating treatment in a nitrogen atmosphere was charged, and cooled to −78° C. Thereafter, 2.38 mL of a 1 N cyclohexane solution of sec-butyllithium (sec-BuLi) (2.30 mmol) was charged into this tetrahydrofuran, and then 13.3 mL of styrene (0.115 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 30 min. Next, as a chain-end terminator, 0.18 mL of propylene sulfide (2.38 mmol), 1 mL of methanol and 0.3 g of p-methoxyphenol were added to conduct a terminating reaction of the polymerization end. The temperature of the reaction solution was elevated to the room temperature, and the reaction solution was concentrated. Thereafter, the solvent was substituted with methyl isobutyl ketone (MIBK). Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Thus obtained polymer was dried under reduced pressure at 60° C. to give 11.3 g of a white polymer (A-6). This polymer (A-6) had the Mw of 5,200, the Mn of 5,000, and the Mw/Mn of 1.04.

Synthesis Example 7

After a 500 mL three-neck flask as a reaction vessel was dried under reduced pressure, 120 g of tetrahydrofuran which had been subjected to a distillation dehydrating treatment in a nitrogen atmosphere was charged, and cooled to −78° C. Thereafter, 1.76 mL of a 1 N cyclohexane solution of sec-butyllithium (sec-BuLi) (1.71 mmol) was charged into this tetrahydrofuran, and then 13.3 mL of styrene (0.115 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 30 min. Next, as a chain-end terminator, 0.11 mL of ethylene sulfide (1.76 mmol), 1 mL of 5% by mass aqueous hydrochloric acid solution and 0.3 g of p-methoxyphenol were charged to conduct a terminating reaction of the polymerization end. The temperature of the reaction solution was elevated to the room temperature, and the reaction solution was concentrated. Thereafter, the solvent was substituted with methyl isobutyl ketone (MIBK). Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 11.7 g of a white polymer (A-7). This polymer (A-7) had the Mw of 7,000, the Mn of 6,800, and the Mw/Mn of 1.03.

Synthesis Example 8

After a 500 mL three-neck flask as a reaction vessel was dried under reduced pressure, 120 g of tetrahydrofuran which had been subjected to a distillation dehydrating treatment in a nitrogen atmosphere was charged, and cooled to −78° C. Thereafter, 4.76 mL of a 1 N cyclohexane solution of sec-butyllithium (sec-BuLi) (4.79 mmol) was charged into this tetrahydrofuran, and then 13.3 mL of styrene (0.115 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 30 min. Next, as a chain-end terminator, 0.29 mL of ethylene sulfide (4.79 mmol), 1 mL of acetic acid and 0.3 g of p-methoxyphenol were charged to conduct a terminating reaction of the polymerization end. The temperature of the reaction solution was elevated to the room temperature, and the reaction solution was concentrated. Thereafter, the solvent was substituted with methyl isobutyl ketone (MIBK). Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 11.6 g of a white polymer (A-8). The polymer (A-8) had the Mw of 2,500, the Mn of 2,400, and the Mw/Mn of 1.04.

Synthesis Example 9

After a 500 mL three-neck flask as a reaction vessel was dried under reduced pressure, 120 g of tetrahydrofuran which had been subjected to a distillation dehydrating treatment in a nitrogen atmosphere was charged, and cooled to −78° C. Thereafter, 2.57 mL of a 1 N cyclohexane solution of sec-butyllithium (sec-BuLi) (2.50 mmol) was charged into this tetrahydrofuran, and then 13.7 mL of tert-butylstyrene (0.0748 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 30 min. Next, as a chain-end terminator, 0.16 mL of ethylene sulfide (2.50 mmol), 1 mL of methanol and 0.3 g of p-methoxyphenol were charged to conduct a terminating reaction of the polymerization end, and then another 0.3 g of p-methoxyphenol was added thereto. The temperature of the reaction solution was elevated to the room temperature, and the reaction solution was concentrated. Thereafter, the solvent was substituted with methyl isobutyl ketone (MIBK). Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Thus obtained polymer was dried under reduced pressure at 60° C. to give 11.3 g of a white polymer (A-9). This polymer (A-9) had the Mw of 5,000, the Mn of 4,800, and the Mw/Mn of 1.04.

Synthesis Example 10

After a 500 mL three-neck flask as a reaction vessel was dried under reduced pressure, 120 g of tetrahydrofuran which had been subjected to a distillation dehydrating treatment in a nitrogen atmosphere was charged, and cooled to −78° C. Thereafter, 2.57 mL of a 1 N cyclohexane solution of sec-butyllithium (sec-BuLi) (2.50 mmol) was charged into this tetrahydrofuran, and then 13.7 mL of tert-butylstyrene (0.0748 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 30 min. Next, as a chain-end terminator, 0.19 mL of propylene sulfide (2.50 mmol) and 1 mL of methanol were charged to conduct a terminating reaction of the polymerization end, and then 0.3 g of p-methoxyphenol was added thereto. The temperature of the reaction solution was elevated to the room temperature, and the reaction solution was concentrated. Thereafter, the solvent was substituted with methyl isobutyl ketone (MIBK). Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 11.8 g of a white polymer (A-10). The polymer (A-10) had the Mw of 4,800, the Mn of 4,500, and the Mw/Mn of 1.07.

Synthesis Example 11

After a 500 mL three-neck flask as a reaction vessel was dried under reduced pressure, 120 g of tetrahydrofuran which had been subjected to a distillation dehydrating treatment in a nitrogen atmosphere was charged, and cooled to −78° C. Thereafter, 2.38 mL of a 1 N cyclohexane solution of sec-butyllithium (sec-BuLi) (2.30 mmol) was charged into this tetrahydrofuran, and then 13.3 mL of styrene (0.115 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 30 min. Next, 0.26 mL of chlorobenzooxazole (2.30 mmol) was charged to conduct a terminating reaction of the polymerization end. The temperature of the reaction solution was elevated to the room temperature, and the reaction solution was concentrated. Thereafter, the solvent was substituted with methyl isobutyl ketone (MIBK). Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 11.5 g of a white polymer (A-11). The polymer (A-11) had the Mw of 5,700, the Mn of 5,200, and the Mw/Mn of 1.10.

Synthesis Example 12

After a 500 mL three-neck flask as a reaction vessel was dried under reduced pressure, 120 g of tetrahydrofuran which had been subjected to a distillation dehydrating treatment in a nitrogen atmosphere was charged, and cooled to −78° C. Thereafter, 2.38 mL of a 1 N cyclohexane solution of sec-butyllithium (sec-BuLi) (2.30 mmol) was charged into this tetrahydrofuran, and then 13.3 mL of styrene (0.115 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 30 min. Next, 0.17 mL of epichlorohydrin (2.30 mmol) was charged to conduct a terminating reaction of the polymerization end. The temperature of the reaction solution was elevated to the room temperature, and the reaction solution was concentrated. Thereafter, the solvent was substituted with methyl isobutyl ketone (MIBK). Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 11.2 g of a white polymer (A-12). The polymer (A-12) had the Mw of 5,700, the Mn of 5,200, and the Mw/Mn of 1.10.

Synthesis Example 13

After a 500 mL three-neck flask as a reaction vessel was dried under reduced pressure, 120 g of tetrahydrofuran which had been subjected to a distillation dehydrating treatment in a nitrogen atmosphere was charged, and cooled to −78° C. Thereafter, 2.38 mL of a 1 N cyclohexane solution of sec-butyllithium (sec-BuLi) (2.31 mmol) was charged into this tetrahydrofuran, and then 13.3 mL of styrene (0.115 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 30 min. Next, as a chain-end terminator, 0.14 mL of ethylene sulfide (2.31 mmol) and 1 mL of methanol were added to conduct a terminating reaction of the polymerization end. The temperature of the reaction solution was elevated to the room temperature, and the reaction solution was concentrated. Thereafter, the solvent was substituted with methyl isobutyl ketone (MIBK). Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Next, the polymer was dissolved in 50 g of tetrahydrofuran and then 1.0 g of azoisobutyronitrile (6.1 mmol) was added thereto. The mixture thus obtained was stirred under heating at 80° C. for 8 hrs in a nitrogen atmosphere and then subjected to a coupling reaction to generate a disulfide body. Thus obtained polymer was dried under reduced pressure at 60° C. to give 11.4 g of a white polymer (A-13). The polymer (A-13) had the Mw of 5,300, the Mn of 5,100, and the Mw/Mn of 1.04.

Synthesis Example 14

After a 500 mL three-neck flask as a reaction vessel was dried under reduced pressure, 120 g of tetrahydrofuran which had been subjected to a distillation dehydrating treatment in a nitrogen atmosphere was charged, and cooled to −78° C. Thereafter, 2.38 mL of a 1 N cyclohexane solution of sec-butyllithium (sec-BuLi) (2.30 mmol) was charged into this tetrahydrofuran, and then 13.3 mL of styrene (0.115 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 30 min. Next, 0.29 mL of 2-chloromethylpyridine (2.30 mmol) was added to conduct a terminating reaction of the polymerization end. The temperature of the reaction solution was elevated to the room temperature, and the reaction solution was concentrated. Thereafter, the solvent was substituted with methyl isobutyl ketone (MIBK). Thereafter, 1,000 g of ultra pure water was charged and the mixture was stirred, followed by removing the aqueous underlayer. This operation was repeated five times to remove oxalic acid, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 11.1 g of a white polymer (A-14). The polymer (A-14) had the Mw of 5,700, the Mn of 5,200, and the Mw/Mn of 1.10.

Synthesis Example 15

To a 200-mL three-neck flask equipped with a condenser, a dropping funnel and a thermometer were added 40 g of anisole, 20.8 g of styrene (0.200 mol), 0.29 g of copper (II) bromide (2.00 mmol) and 0.46 g of tris[(2-dimethylamino)ethyl]amine (2 mmol), and the mixture was heated to 100° C. To the mixture heated, 0.53 mL of 2-bromoethylisobutyrate (3.6 mmol) was added and the resulting mixture was stirred under a nitrogen flow under heating for 8 hrs. Thus obtained polymerization solution was diluted with 100 g of ethyl acetate and subjected to Celite filtration to remove copper complex. The filtrate was washed with 500 g of ultra pure water five times. The organic layer was collected and concentrated to obtain a resin solution. 50 g of tetrahydrofuran was added to the resin solution, and the resulting mixture was subjected to purification through precipitation in 1,000 g of methanol, whereby a polymer was precipitated, and the solid was collected on a Buechner funnel, and rinsed with 50 g of methanol. Thus obtained solid was dried under reduced pressure to give 11.2 g of a white polymer (A-15). The polymer (A-15) had the Mw of 5,600, the Mn of 4,600, and the Mw/Mn of 1.22.

Synthesis Example 16

After a 500 mL three-neck flask as a reaction vessel was dried under reduced pressure, 120 g of THF which had been subjected to a distillation dehydrating treatment in a nitrogen atmosphere was charged, and cooled to −78° C. Thereafter, 1.02 mL of 1,1-diphenylethylene (7.19 mmol), 9.59 mL of a 1 M tetrahydrofuran solution of lithium chloride (4.79 mmol), and 2.47 mL of a 1 N cyclohexane solution of sec-butyllithium (sec-BuLi) (2.40 mmol) were charged into this THF, and then 12.7 mL of methyl methacrylate (0.120 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 120 min. Next, 2.40 mL of a 1 N toluene solution of ethylene oxide (2.40 mmol) was added thereto and then 1 mL of methanol was charged to conduct a terminating reaction of the polymerization end. The temperature of the reaction solution was elevated to the room temperature, and the reaction solution was concentrated. Thereafter, the solvent was substituted with MIBK. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 11.2 g of a white polymer (A-16). This polymer (A-16) had the Mw of 5,200, the Mn of 5,000, and the Mw/Mn of 1.04.

Synthesis Example 17

After a 500 mL three-neck flask as a reaction vessel was dried under reduced pressure, 120 g of THF which had been subjected to a distillation dehydrating treatment in a nitrogen atmosphere was charged, and cooled to −78° C. Thereafter, 1.02 mL of 1,1-diphenylethylene (7.19 mmol), 9.59 mL of a 1 M tetrahydrofuran solution of lithium chloride (4.79 mmol), and 2.47 mL of a 1 N cyclohexane solution of sec-butyllithium (sec-BuLi) (2.40 mmol) were charged into this THF, and then 12.7 mL of methyl methacrylate (0.120 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 120 min. Next, 0.14 mL of ethylene sulfide (2.40 mmol) was added, and then 1 mL of methanol and 1 g of p-methoxyphenol were charged to conduct a terminating reaction of the polymerization end. The temperature of the reaction solution was elevated to the room temperature, and the reaction solution was concentrated. Thereafter, the solvent was substituted with MIBK. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 11.0 g of a white polymer (A-17). This polymer (A-17) had the Mw of 5,200, the Mn of 5,000, and the Mw/Mn of 1.04.

Synthesis Example 18

After a 500 mL three-neck flask as a reaction vessel was dried under reduced pressure, 120 g of THF which had been subjected to a distillation dehydrating treatment in a nitrogen atmosphere was charged, and cooled to −78° C. Thereafter, 1.02 mL of 1,1-diphenylethylene (7.19 mmol), 9.59 mL of a 1 M tetrahydrofuran solution of lithium chloride (4.79 mmol), and 2.47 mL of a 1 N cyclohexane solution of sec-butyllithium (sec-BuLi) (2.40 mmol) were charged into this THF, and then 12.7 mL of methyl methacrylate (0.120 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 120 min. Next, 0.19 mL of 3-bromopropionitrile (2.40 mmol) was added, and then 1 mL of methanol and 1 g of p-methoxyphenol were charged to conduct a terminating reaction of the polymerization end. The temperature of the reaction solution was elevated to the room temperature, and the reaction solution was concentrated. Thereafter, the solvent was substituted with MIBK. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Thus obtained polymer was dried under reduced pressure at 60° C. to give 11.3 g of a white polymer (A-18). This polymer (A-18) had the Mw of 5,200, the Mn of 5,000, and the Mw/Mn of 1.04.

Synthesis Example 19

After a 500 mL three-neck flask as a reaction vessel was dried under reduced pressure, 120 g of THF which had been subjected to a distillation dehydrating treatment in a nitrogen atmosphere was charged, and cooled to −78° C. Thereafter, 1.02 mL of 1,1-diphenylethylene(7.19 mmol), 9.59 mL of a 1 M tetrahydrofuran solution of lithium chloride (4.79 mmol), and 2.47 mL of a 1 N cyclohexane solution of sec-butyllithium (sec-BuLi) (2.40 mmol) were charged into this THF, and then 12.7 mL of methyl methacrylate (0.120 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 120 min. Next, 0.21 mL of allyl bromide (2.40 mmol) was added to conduct a terminating reaction of the polymerization end. The temperature of the reaction solution was elevated to the room temperature, and the reaction solution was concentrated. Thereafter, the solvent was substituted with MIBK. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Thus obtained polymer was dried under reduced pressure at 60° C. to give 11.1 g of a white polymer (A-19). This polymer (A-19) had the Mw of 5,200, the Mn of 5,000, and the Mw/Mn of 1.04.

Synthesis Example 20

After a 500 mL three-neck flask as a reaction vessel was dried under reduced pressure, 120 g of THF which had been subjected to a distillation dehydrating treatment in a nitrogen atmosphere was charged, and cooled to −78° C. Thereafter, 2.38 mL of a 1 N cyclohexane solution of sec-butyllithium (sec-BuLi) (2.30 mmol) was charged into this THF, and then 13.3 mL of styrene (0.115 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 30 min and carbon dioxide was blown thereinto. Next, 1.0 g of methanol was charged to conduct a terminating reaction of the polymerization end. The reaction solution was cooled to the room temperature, and the reaction solution was concentrated. Thereafter, the solvent was substituted with MIBK. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 11.6 g of a white polymer (A-20). The polymer (A-20) had the Mw of 5,300, the Mn of 4,900, and the Mw/Mn of 1.08.

Synthesis Example 21

After a 500 mL three-neck flask as a reaction vessel was dried under reduced pressure, 120 g of THF which had been subjected to a distillation dehydrating treatment in a nitrogen atmosphere was charged, and cooled to −78° C. Thereafter, 2.38 mL of a 1 N cyclohexane solution of sec-butyllithium (sec-BuLi) (2.31 mmol) was charged into this THF, and then 13.3 mL of styrene (0.115 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 30 min. Then, 0.98 mL of 1,1-diphenylethylene (6.91 mmol) was added thereto and the color of the mixture was ascertained to be dark brown. Next, as a chain-end terminator, 0.14 mL of carbon disulfide (2.30 mmol) and 1 mL of methanol were charged to conduct a terminating reaction of the polymerization end. The temperature of the reaction solution was elevated to the room temperature, and the reaction solution was concentrated. Thereafter, the solvent was substituted with MIBK. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 11.8 g of a white polymer (A-21). The polymer (A-21) had the Mw of 5,500, the Mn of 5,300, and the Mw/Mn of 1.04.

Synthesis Example 22

After a 500 mL three-neck flask as a reaction vessel was dried under reduced pressure, 120 g of THF which had been subjected to a distillation dehydrating treatment in a nitrogen atmosphere was charged, and cooled to −78° C. Thereafter, 2.38 mL of a 1 N cyclohexane solution of sec-butyllithium (sec-BuLi) (2.31 mmol) was charged into this THF, and then 13.3 mL of styrene (0.115 mol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 30 min. Next, 0.41 mL of diphenyl phosphoric acid chloride (2.30 mmol) as a chain-end terminator was charged to conduct a terminating reaction of the polymerization end. The temperature of the reaction solution was elevated to the room temperature, and the reaction solution was concentrated. Thereafter, the solvent was substituted with MIBK. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Next, the collected white solid was dissolved in 100 g of tetrahydrofuran. To the solution thus obtained were added 10 g of triethylamine and 5 g of methanol, and the resulting mixture was subjected to a hydrolysis reaction under reflux for 5 hrs. Purification through precipitation in 1,000 g of methanol was conducted again to give a white solid. Thus obtained solid was dried under reduced pressure at 60° C. to give 11.8 g of a white polymer (A-22). The polymer (A-22) had the Mw of 4,900, the Mn of 4,700, and the Mw/Mn of 1.04.

Synthesis Example 23

Into a 200 mL three-neck flask as a reaction vessel, 0.098 g of azoisobutyronitrile (0.6 mmol), 12.5 g of styrene (120 mmol), 0.83 g of 2-cyano-2-propyldodecyl trithiocarbonate (2.4 mmol) and 20 g of anisole were added and degassing of the mixture was conducted three times under a reduced pressure on a dry ice bath, and a nitrogen atmosphere was provided. After the temperature was ascertained to be elevated to a normal temperature, the mixture was heated with stirring at 80° C. for 5 hrs. Moreover, a mixture of 0.48 mL of vinyl phosphoric acid and 1 mL of ethylene glycol monomethyl ether was charged with a syringe, and the mixture was further heated with stirring at 80° C. for 3 hrs.

This polymerization solution was purified by precipitation in 300 g of n-hexane to collect a yellow solid. Thus obtained yellow solid was dissolved in 100 g of tetrahydrofuran, and thereto were added 1.97 g of azoisobutyronitrile (12 mmol) and 2.02 g of tert-butyldodecyl mercaptan (10 mmol). The mixture was refluxed at 80° C. for 2 hrs to carry out a cleavage reaction of a trithiocarbonate end. The polymerization solution thus obtained was purified by precipitation in 1,000 g of methanol to give a pale yellowish solid. Thus obtained solid was dried under reduced pressure at 60° C. to give 10.2 g of a white polymer (A-23). The polymer (A-23) had the Mw of 4,800, the Mn of 4,300, and the Mw/Mn of 1.12.

Synthesis Example 24

After a 500 mL three-neck flask as a reaction vessel was dried under reduced pressure, 120 g of THF which had been subjected to a distillation dehydrating treatment in a nitrogen atmosphere was charged, and cooled to −78° C. Thereafter, 2.13 mL of a 1 N cyclohexane solution of sec-butyllithium (sec-BuLi) (2.07 mmol) was charged into this THF, and then 11.4 mL of styrene (0.062 mol) and 0.5 mL of 4-vinylbenzocyclobutene (3.84 mmol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. Next, as a chain-end terminator, 0.16 mL of propylene sulfide (2.07 mmol), 1 mL of methanol and 0.01 g of p-methoxyphenol were added to conduct a terminating reaction of the polymerization end. The temperature of the reaction solution was elevated to the room temperature, and the reaction solution was concentrated. Thereafter, the solvent was substituted with MIBK. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 9.8 g of a white polymer (A-24). This polymer (A-24) had the Mw of 5,000, the Mn of 4,700, and the Mw/Mn of 1.06.

Synthesis Example 25

After a 500 mL three-neck flask as a reaction vessel was dried under reduced pressure, 120 g of THF which had been subjected to a distillation dehydrating treatment in a nitrogen atmosphere was charged, and cooled to −78° C. Thereafter, 2.09 mL of a 1 N cyclohexane solution of sec-butyllithium (sec-BuLi) (2.03 mmol) was charged into this THF, and then 11.1 mL of styrene (0.062 mol) and 0.7 mL of 4-vinylbenzocyclobutene (5.38 mmol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. Next, as a chain-end terminator, 0.34 mL of bromopropionitrile (2.03 mmol), 4.1 mL of a 0.5 N tetrahydrofuran solution of lithium chloride (2.03 mmol) were added to conduct a terminating reaction of the polymerization end. The temperature of the reaction solution was elevated to the room temperature, and the reaction solution was concentrated. Thereafter, the solvent was substituted with MIBK. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 10.3 g of a white polymer (A-25). This polymer (A-25) had the Mw of 5,200, the Mn of 4,900, and the Mw/Mn of 1.06.

Preparation of 4-allylstyrene

To a 500-mL three-neck flask equipped with a condenser and a dropping funnel were added 100 mL of dry tetrahydrofuran and 3.01 g of magnesium (111 mmol), and the mixture was stirred with addition of 12.7 mL of 4-chlorostyrene (106 mmol) with the dropping funnel under ice-cooling, to purify the Grignard reagent. To this Grignard reagent, 7.85 mL of allyl bromide (92 mmol) was added with the dropping funnel, and then heated at 50° C. with stirring in a nitrogen atmosphere. After completion of the reaction, the mixture was filtered to collect a filtrate, to which methyl ethyl ketone was added, followed by washing with water and then concentration in vacuo. Next, vacuum distillation gave 12.1 g of an intended product (yield: 92%), with a fraction at a boiling point of 78° C./10 Pa as a main fraction.

GC-MASS m/z; 144.09

$^1$H-NMR (CDCl$_3$); 7.59 (2H, m-Ph), 7.18 (2H, o-Ph), 6.63 (1H, —CH═), 5.61, 5.18 (2H, CH$_2$), 5.25 (3H, allyl), 2.34 (2H, —CH$_2$—)

Synthesis Example 26

After a 500 mL three-neck flask as a reaction vessel was dried under reduced pressure, 120 g of THF which had been subjected to a distillation dehydrating treatment in a nitrogen atmosphere was charged, and cooled to −78° C. Thereafter, 2.09 mL of a 1 N cyclohexane solution of sec-butyllithium (sec-BuLi) (2.03 mmol) was charged into this THF, and then 11.1 mL of styrene (0.062 mol) and 0.78 mL of 4-allylstyrene (5.38 mmol) which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. Next, as a chain-end terminator, 0.34 mL of bromopropionitrile (2.03 mmol), 4.1 mL of a 0.5 N tetrahydrofuran solution of lithium chloride (2.03 mmol) were added to conduct a terminating reaction of the polymerization end. The temperature of the reaction solution was elevated to the room temperature, and the reaction solution was concentrated. Thereafter, the solvent was substituted with MIBK. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. Thus obtained solid was dried under reduced pressure at 60° C. to give 10.5 g of a white polymer (A-26). The polymer (A-26) had the Mw of 5,300, the Mn of 5,100, and the Mw/Mn of 1.04.

Preparation of Composition

Preparation Example 1

A composition (S-1) was prepared by: adding 98.8 g of propylene glycol monomethyl acetate (PGMEA) as the solvent (B) to 1.2 g of (A-1) as the polymer (A); stirring the mixture; and then filtering the stirred mixture through a high-density polyethylene filter with fine pores having a pore size of 0.45 μm.

Preparation Examples 2 to 26

Compositions (S-2) to (S-26) were prepared by a similar operation to that of Preparation Example 1 except that the type and the content of each component used were as shown in Table 1.

TABLE 1

| | | | Amount Blended (mass (g)) Preparation Examples | | | | | | | | |
|---|---|---|---|---|---|---|---|---|---|---|---|
| | | Composition | 1 S-1 | 2 S-2 | 3 S-3 | 4 S-4 | 5 S-5 | 6 S-6 | 7 S-7 | 8 S-8 | 9 S-9 |
| Polymer (A) | A-1 | PS-ω-H | 1.2 | | | | | | | | |
| | A-2 | PS-ω-DOH | | 1.2 | | | | | | | |
| | A-3 | PS-ω-CN | | | 1.2 | | | | | | |
| | A-4 | PS-ω-Allyl | | | | 1.2 | | | | | |
| | A-5 | PS-ω-SHp (5.1k) | | | | | 1.2 | | | | |
| | A-6 | PS-ω-SHs | | | | | | 1.2 | | | |
| | A-7 | PS-ω-SHp (6.8k) | | | | | | | 1.2 | | |
| | A-8 | PS-ω-SHp (2.4k) | | | | | | | | 1.2 | |
| | A-9 | tBuSt-ω-SHp | | | | | | | | | 1.2 |
| | A-10 | tBuSt-ω-SHs | | | | | | | | | |
| | A-11 | PS-ω-BOZ | | | | | | | | | |
| | A-12 | PS-ω-EPX | | | | | | | | | |
| | A-13 | PS-ω-SS | | | | | | | | | |
| | A-14 | PS-ω-Pyridine | | | | | | | | | |
| | A-15 | PS-ω-Br | | | | | | | | | |
| | A-16 | PMMA-ω-Ohp | | | | | | | | | |
| | A-17 | PMMA-ω-SHp | | | | | | | | | |
| | A-18 | PMMA-ω-CN | | | | | | | | | |
| | A-19 | PMMA-ω-Allyl | | | | | | | | | |
| | A-20 | PS-ω-COOH | | | | | | | | | |
| | A-21 | PS-ω-CSSH | | | | | | | | | |
| | A-22 | PS-ω-PA | | | | | | | | | |
| | A-23 | PS-b-VPA | | | | | | | | | |
| | A-24 | tBuSt-r-BCB-ω-SHs | | | | | | | | | |
| | A-25 | PS-r-BCB-ω-CN | | | | | | | | | |
| | A-26 | PS-r-allylSt-ω-CN | | | | | | | | | |
| Solvent (B) | B-1 | PGMEA | 98.8 | 98.8 | 98.8 | 98.8 | 98.8 | 98.8 | 98.8 | 98.8 | 98.8 |

| | | | Amount Blended (mass (g)) Preparation Examples | | | | | |
|---|---|---|---|---|---|---|---|---|
| | | Composition | 10 S-10 | 11 S-11 | 12 S-12 | 13 S-13 | 14 S-14 | 15 S-15 |
| Polymer (A) | A-1 | PS-ω-H | | | | | | |
| | A-2 | PS-ω-DOH | | | | | | |
| | A-3 | PS-ω-CN | | | | | | |
| | A-4 | PS-ω-Allyl | | | | | | |

TABLE 1-continued

|  |  | Composition |  |  |  |  |  |  |
|---|---|---|---|---|---|---|---|---|
|  | A-5 | PS-ω-SHp (5.1k) |  |  |  |  |  |  |
|  | A-6 | PS-ω-SHs |  |  |  |  |  |  |
|  | A-7 | PS-ω-SHp (6.8k) |  |  |  |  |  |  |
|  | A-8 | PS-ω-SHp (2.4k) |  |  |  |  |  |  |
|  | A-9 | tBuSt-ω-SHp |  |  |  |  |  |  |
|  | A-10 | tBuSt-ω-SHs | 1.2 |  |  |  |  |  |
|  | A-11 | PS-ω-BOZ |  | 1.2 |  |  |  |  |
|  | A-12 | PS-ω-EPX |  |  | 1.2 |  |  |  |
|  | A-13 | PS-ω-SS |  |  |  | 1.2 |  |  |
|  | A-14 | PS-ω-Pyridine |  |  |  |  | 1.2 |  |
|  | A-15 | PS-ω-Br |  |  |  |  |  | 1.2 |
|  | A-16 | PMMA-ω-Ohp |  |  |  |  |  |  |
|  | A-17 | PMMA-ω-SHp |  |  |  |  |  |  |
|  | A-18 | PMMA-ω-CN |  |  |  |  |  |  |
|  | A-19 | PMMA-ω-Allyl |  |  |  |  |  |  |
|  | A-20 | PS-ω-COOH |  |  |  |  |  |  |
|  | A-21 | PS-ω-CSSH |  |  |  |  |  |  |
|  | A-22 | PS-ω-PA |  |  |  |  |  |  |
|  | A-23 | PS-b-VPA |  |  |  |  |  |  |
|  | A-24 | tBuSt-r-BCB-ω-SHs |  |  |  |  |  |  |
|  | A-25 | PS-r-BCB-ω-CN |  |  |  |  |  |  |
|  | A-26 | PS-r-allylSt-ω-CN |  |  |  |  |  |  |
| Solvent (B) | B-1 | PGMEA | 98.8 | 98.8 | 98.8 | 98.8 | 98.8 | 98.8 |

|  |  |  | Amount Blended (mass (g)) Preparation Examples |  |  |  |  |  |
|---|---|---|---|---|---|---|---|---|
|  |  | Composition | 16 S-16 | 17 S-17 | 18 S-18 | 19 S-19 | 20 S-20 | 21 S-21 |
| Polymer (A) | A-1 | PS-ω-H |  |  |  |  |  |  |
|  | A-2 | PS-ω-DOH |  |  |  |  |  |  |
|  | A-3 | PS-ω-CN |  |  |  |  |  |  |
|  | A-4 | PS-ω-Allyl |  |  |  |  |  |  |
|  | A-5 | PS-ω-SHp (5.1k) |  |  |  |  |  |  |
|  | A-6 | PS-ω-SHs |  |  |  |  |  |  |
|  | A-7 | PS-ω-SHp (6.8k) |  |  |  |  |  |  |
|  | A-8 | PS-ω-SHp (2.4k) |  |  |  |  |  |  |
|  | A-9 | tBuSt-ω-SHp |  |  |  |  |  |  |
|  | A-10 | tBuSt-ω-SHs |  |  |  |  |  |  |
|  | A-11 | PS-ω-BOZ |  |  |  |  |  |  |
|  | A-12 | PS-ω-EPX |  |  |  |  |  |  |
|  | A-13 | PS-ω-SS |  |  |  |  |  |  |
|  | A-14 | PS-ω-Pyridine |  |  |  |  |  |  |
|  | A-15 | PS-ω-Br |  |  |  |  |  |  |
|  | A-16 | PMMA-ω-Ohp | 1.2 |  |  |  |  |  |
|  | A-17 | PMMA-ω-SHp |  | 1.2 |  |  |  |  |
|  | A-18 | PMMA-ω-CN |  |  | 1.2 |  |  |  |
|  | A-19 | PMMA-ω-Allyl |  |  |  | 1.2 |  |  |
|  | A-20 | PS-ω-COOH |  |  |  |  | 1.2 |  |
|  | A-21 | PS-ω-CSSH |  |  |  |  |  | 1.2 |
|  | A-22 | PS-ω-PA |  |  |  |  |  |  |
|  | A-23 | PS-b-VPA |  |  |  |  |  |  |
|  | A-24 | tBuSt-r-BCB-ω-SHs |  |  |  |  |  |  |
|  | A-25 | PS-r-BCB-ω-CN |  |  |  |  |  |  |
|  | A-26 | PS-r-allylSt-ω-CN |  |  |  |  |  |  |
| Solvent (B) | B-1 | PGMEA | 98.8 | 98.8 | 98.8 | 98.8 | 98.8 | 98.8 |

|  |  |  | Amount Blended (mass (g)) Preparation Examples |  |  |  |  |
|---|---|---|---|---|---|---|---|
|  |  | Composition | 22 S-22 | 23 S-23 | 24 S-24 | 25 S-25 | 26 S-26 |
| Polymer (A) | A-1 | PS-ω-H |  |  |  |  |  |
|  | A-2 | PS-ω-DOH |  |  |  |  |  |
|  | A-3 | PS-ω-CN |  |  |  |  |  |
|  | A-4 | PS-ω-Allyl |  |  |  |  |  |
|  | A-5 | PS-ω-SHp (5.1k) |  |  |  |  |  |
|  | A-6 | PS-ω-SHs |  |  |  |  |  |
|  | A-7 | PS-ω-SHp (6.8k) |  |  |  |  |  |
|  | A-8 | PS-ω-SHp (2.4k) |  |  |  |  |  |
|  | A-9 | tBuSt-ω-SHp |  |  |  |  |  |
|  | A-10 | tBuSt-ω-SHs |  |  |  |  |  |
|  | A-11 | PS-ω-BOZ |  |  |  |  |  |
|  | A-12 | PS-ω-EPX |  |  |  |  |  |
|  | A-13 | PS-ω-SS |  |  |  |  |  |
|  | A-14 | PS-ω-Pyridine |  |  |  |  |  |

TABLE 1-continued

|   | | | | | | | |
|---|---|---|---|---|---|---|---|
| | A-15 | PS-ω-Br | | | | | |
| | A-16 | PMMA-ω-Ohp | | | | | |
| | A-17 | PMMA-ω-SHp | | | | | |
| | A-18 | PMMA-ω-CN | | | | | |
| | A-19 | PMMA-ω-Allyl | | | | | |
| | A-20 | PS-ω-COOH | | | | | |
| | A-21 | PS-ω-CSSH | | | | | |
| | A-22 | PS-ω-PA | 1.2 | | | | |
| | A-23 | PS-b-VPA | | 1.2 | | | |
| | A-24 | tBuSt-r-BCB-ω-SHs | | | 1.2 | | |
| | A-25 | PS-r-BCB-ω-CN | | | | 1.2 | |
| | A-26 | PS-r-allylSt-ω-CN | | | | | 1.2 |
| Solvent (B) | B-1 | PGMEA | 98.8 | 98.8 | 98.8 | 98.8 | 98.8 |

Evaluations

Each of the compositions prepared as described above was evaluated according to the following method.

Evaluation of Selective Surface Modification on Metal Substrate

Examples 1 to 25, 29 to 31 and 34 to 36, Comparative Examples 1 and 2, and Reference Examples 1 to 7

An eight-inch substrate (copper substrate, cobalt substrate, tungsten substrate, tantalum substrate or tantalum nitride film substrate) was immersed in a 5% by mass aqueous oxalic acid solution and then dried with a nitride flow, and an oxide film on the surface was removed. The silicon oxide substrate was subjected to a surface treatment with isopropanol.

Next, the compositions prepared as described above were spin-coated by using Track ("TELDSA ACT8" available from Tokyo Electron Limited) at 1,500 rpm, and baked at 150° C. for 180 sec. The substrate was subjected to a separation with PGMEA to remove unreacted polymer. The selective surface modification material formed on the substrate had a thickness of about 0 nm to 5 nm as a result of the measurement of the film thickness with an ellipsometer. Next, the surface contact angle (SCA) value was measured by using a contact angle meter ("Drop master DM-501" available from Kyowa Interface Science Co., LTD.). Furthermore, arrangement density σ (chains/nm$^2$) of the polymer (A) (brush) was calculated on the basis of the film thickness according to the following formula (1):

$$\sigma = d \times L \times NA \times 10^{-21}/Mn \quad (1)$$

d: density (g/cm$^3$) of polymer (A); L: average thickness (nm) of the film; NA: Avogadro's number; and Mn: number average molecular weight of polymer (A).

With respect to each metal substrate and each silicon oxide substrate, the average thickness (nm), the contact angle(°) and polymer (brush) density (chains/nm$^2$) of the polymer film formed on the surface of the substrate are shown in Table 2, respectively. In Table 2, "-" denotes that the selectivity on the substrate surface was not indicated and therefore the arrangement density of the polymer was not calculated.

TABLE 2

| | | Composition | | | | | |
|---|---|---|---|---|---|---|---|
| | | | Thickness (nm) | | SCA (°) | | Brush |
| | | Sample | | | Copper | Si oxide | |
| | Copper substrate | (Control) | Copper | Si oxide | 10 | 36 | density(chains/nm$^2$) |
| Reference Example 1 | S-2 | PS-ω-DOH | 3.5 | 3.6 | 89 | 88 | — |
| Example 1 | S-3 | PS-ω-CN | 4.1 | 0.6 | 88 | 39 | 0.45 |
| Example 2 | S-4 | PS-ω-Allyl | 3.5 | 0.8 | 87 | 49 | 0.38 |
| Example 3 | S-5 | PS-ω-SHp (5.1k) | 5.0 | 0.7 | 88 | 47 | 0.58 |
| Example 4 | S-6 | PS-ω-SHs | 3.8 | 0.7 | 88 | 46 | 0.45 |
| Example 5 | S-11 | PS-ω-BOZ | 3.6 | 0.9 | 89 | 49 | 0.43 |
| Example 29 | S-21 | PS-ω-CSSH | 3.6 | 0.9 | 89 | 54 | 0.42 |
| Example 30 | S-22 | PS-PA | 4.2 | 0.5 | 89 | 37 | 0.53 |
| Exarqple 31 | S-23 | PS-b-VPA | 3.6 | 0.4 | 87 | 38 | 0.52 |
| Example 34 | S-24 | tBUSt-r-BCB-ω-SHs | 4.1 | 0.6 | 102 | 39 | 0.54 |
| Example 35 | S-25 | PS-r-BCB-ω-CN | 4.2 | 0.5 | 89 | 38 | 0.53 |
| Example 36 | S-26 | PS-r-allylSt-ω-CN | 4.1 | 0.4 | 90 | 40 | 0.49 |
| | Cobalt substrate | (Control) | Cobalt | Si oxide | Cobalt 10 | Si oxide 36 | |
| Comparative Example 1 | S-10 | PS-ω-H | 0.6 | 0.7 | 42 | 45 | — |
| Reference Example 2 | S-2 | PS-ω-DOH | 3.7 | 3.6 | 89 | 88 | — |
| Example 6 | S-7 | PS-ω-SHp (6.8k) | 5.4 | 0.5 | 88 | 46 | 0.49 |
| Example 7 | S-5 | PS-ω-SHp (5.1k) | 5.0 | 0.4 | 88 | 47 | 0.58 |
| Example 8 | S-8 | PS-ω-SHp (2.4k) | 4.2 | 0.5 | 89 | 46 | 1.09 |

TABLE 2-continued

| | | | | | | |
|---|---|---|---|---|---|---|
| Example 9 | S-6 | PS-ω-SHs | 3.8 | 0.7 | 90 | 46 | 0.45 |
| Example 10 | S-9 | PtBuSt-ω-SHp | 5.3 | 0.6 | 102 | 52 | 0.68 |
| Example 11 | S-10 | PtBuSt-ω-SHs | 5.1 | 0.5 | 102 | 47 | 0.72 |

| | | Composition | | | SCA (°) | | |
|---|---|---|---|---|---|---|---|
| | | Sample | Thickness (nm) | | W | Si oxide | Brush |
| Tungsten substrate | (Control) | | W | Si oxide | 10 | 36 | density(chains/nm$^2$) |
| Comparative Example 2 | S-1 | PS-ω-H | 0.6 | 0.6 | 43 | 44 | — |
| Reference Example 3 | S-2 | PS-ω-DOH | 3.6 | 3.6 | 89 | 89 | — |
| Example 12 | S-12 | PS-ω-EPX | 4.2 | 0.5 | 88 | 45 | 0.51 |
| Example 13 | S-3 | PS-ω-CN | 3.7 | 0.3 | 89 | 39 | 0.41 |
| Example 14 | S-5 | PS-ω-SHp (5.1k) | 5.1 | 0.6 | 88 | 47 | 0.60 |
| Example 15 | S-13 | PS-ω-SS | 5.3 | 0.5 | 86 | 48 | 0.64 |
| Tantalum substrate | (Control) | | Tantalum | Si oxide | Tantalum 50 | Si oxide 46 | |
| Reference Example 4 | S-2 | PS-ω-DOX | 3.5 | 3.6 | 89 | 88 | — |
| Reference Example 5 | S-14 | PS-ω-Pylidine | 3.5 | 1.8 | 88 | 72 | — |
| Example 16 | S-7 | PS-ω-SHp (6.8k) | 4.9 | 0.4 | 92 | 44 | 0.57 |
| Example 17 | S-3 | PS-ω-CN | 4.3 | 0.7 | 90 | 54 | 0.48 |
| Example 18 | S-4 | PS-ω-Allyl | 4.6 | 0.5 | 92 | 57 | 0.50 |
| Tantalum nitride substrate | (Control) | | TaN | Si oxide | TaN 37 | Si oxide 46 | |
| Reference Example 6 | S-2 | PS-ω-DOH | 3.6 | 3.6 | 89 | 88 | — |
| Example 19 | S-5 | PS-ω-SHp (5.1k) | 4.8 | 0.4 | 91 | 44 | 0.56 |
| Example 20 | S-3 | PS-ω-CN | 4.3 | 0.6 | 90 | 54 | 0.48 |
| Example 21 | S-4 | PS-ω-Allyl | 4.4 | 0.7 | 90 | 57 | 0.49 |
| Example 22 | S-15 | PS-ω-Br | 4.1 | 0.5 | 90 | 48 | 0.45 |
| Cobalt substrate | (Control) | | Copper | Si Oxide | Copper 10 | Si oxide 36 | |
| Reference Example 7 | S-16 | PMMA-ω-OHp | 3.5 | 3.5 | 68 | 68 | — |
| Example 23 | S-17 | PMMA-ω-SHp | 5.1 | 0.4 | 69 | 38 | 0.61 |
| Example 24 | S-18 | PMMA-ω-CN | 4.4 | 0.6 | 68 | 37 | 0.50 |
| Example 25 | S-19 | PMMA-ω-Allyl | 4.3 | 0.5 | 68 | 37 | 0.48 |

Evaluation of Selective Surface Modification on Striped Substrate of Copper-Silicon Oxide Examples 26 to 28, 32 to 33 and 37 to 39, Comparative Example 3 and Reference Example 8

Figure 2:
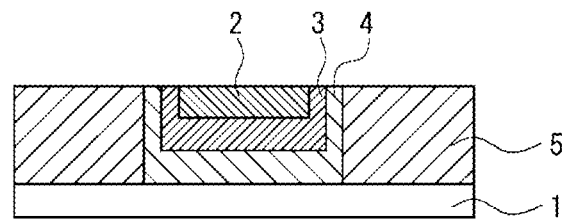
FIG. 2 is a cross sectional view illustrating a cross sectional view of a striped substrate used for evaluation of selective surface modification.

An eight-inch substrate shown in FIG. 1 (Cu-EPC (2): 10,000 Å/Cu-Seed (3): 1,000 Å/TaN Barrier Layer (4): 250 Å/silicon oxide (5): 5,000 Å/silicon wafer (1), 0.18 μm trench) was ground with a CMP slurry to produce a substrate including copper and silicon oxide arranged in a striped shape as shown in FIG. 2 below. Next, this substrate was immersed in a 5% by mass aqueous oxalic acid solution and thereafter dried with a nitrogen flow, whereby the oxidized coating film on the surface was removed.

The compositions prepared as described above were spin-coated on the substrate by using Track ("TELDSA ACTS" available from Tokyo Electron Limited) at 1,500 rpm, and baked at 150° C. for 180 sec. The substrate was subjected to a separation with PGMEA to remove unreacted polymer. Next, the surface was observed under a scanning probe microscope ("S-image" (microscope unit) and "Nano Navi Real" (control station) available from Hitachi High-Technologies Science Corporation), and the film thickness of the coating was calculated from the recess and protrusion.

Average thickness (nm) of the coating film of the polymer formed on each region containing copper or silicon oxide on the copper-silicon oxide striped substrate is each shown in Table 3. In Table 3, "ND" indicates that the thickness was so small that the detection failed.

TABLE 3

Copper-silicon oxide striped substrate

| | | | Thickness (nm) | |
|---|---|---|---|---|
| | Composition | Sample | Copper | Si oxide |
| Comparative Example 3 | S-1 | PS-ω-H | ND | ND |
| Reference Example 8 | S-20 | PS-ω-COOH | 4.5 | 4.6 |
| Example 26 | S-5 | PS-ω-SHp (5.1k) | 5.1 | ND |
| Example 27 | S-8 | PS-ω-SHp (2.4k) | 4.4 | ND |
| Example 28 | S-3 | PS-ω-CN | 4.3 | ND |
| Example 32 | S-22 | PS-ω-PA | 4.4 | ND |
| Example 33 | S-23 | PS-b-VPA | 5.1 | ND |

TABLE 3-continued

Copper-silicon oxide striped substrate

| | | | Thickness (nm) | |
|---|---|---|---|---|
| | Composition | Sample | Copper | Si oxide |
| Example 37 | S-24 | tBuSt-r-BCB-ω-SHs | 5.1 | ND |
| Example 38 | S-25 | PS-r-BCB-ω-CN | 4.9 | ND |
| Example 39 | S-26 | PS-r-allylSt-ω-CN | 4.9 | ND |

From the results shown in Tables 2 and 3, it was revealed that the method for selectively modifying a base material surface of Examples enabled easy, highly selective and dense modification of surface regions containing the metal.

The method for selectively modifying a base material surface and the composition for use in selective modification of a base material surface of the embodiments of the present invention enable easy, highly selective and dense modification of surface regions containing the metal. Therefore, the method for selectively modifying a base material surface and the composition can be each suitably used for working processes of semiconductor devices, and the like, in which microfabrication is expected to be further in progress hereafter.

Obviously, numerous modifications and variations of the present invention are possible in light of the above teachings. It is therefore to be understood that within the scope of the appended claims, the invention may be practiced otherwise than as specifically described herein.

The invention claimed is:

1. A composition for selective modification of a base material surface, comprising:
   a polymer comprising, at an end of a main chain or a side chain thereof, a group comprising a first functional group that forms a bond with a metal; and
   a solvent dissolving or dispersing the polymer,
   wherein the polymer comprises a structural unit having a crosslinkable group derived from 4-vinylbenzocyclobutene, and at least one of a structural unit derived from styrene, a structural unit derived from t-butylstyrene and a structural unit derived from methyl (meth) acrylate, and the first functional group is a primary cyano group, a sulfanyl group, an oxazoline ring-containing group, a phosphoric acid group, an epoxy group or a disulfide group.

2. The composition according to claim 1, wherein the metal is copper, iron, zinc, cobalt, aluminum, titanium, tin, tungsten, zirconium, tantalum, germanium, molybdenum, ruthenium, gold, silver, platinum, palladium or nickel.

3. The composition according to claim 1, wherein a polystyrene equivalent number average molecular weight of the polymer is no less than 500 and no greater than 50,000.

4. The composition according to claim 1, wherein the first functional group is a sulfanyl group, an oxazoline ring-containing group, a phosphoric acid group, an epoxy group or a disulfide group.

5. The composition according to claim 1, wherein the polymer comprises the structural unit derived from styrene.

6. The composition according to claim 1, wherein the polymer comprises, at one end of the main chain thereof, the group comprising the first functional group.

7. The composition according to claim 1, wherein the polymer comprises the structural unit derived from methyl (meth)acrylate.

8. The composition according to claim 1, wherein the polymer comprises the structural unit derived from t-butylstyrene.

9. The composition according to claim 1, wherein the polymer comprises the structural unit derived from styrene, the structural unit derived from t-butylstyrene, and the structural unit derived from methyl (meth)acrylate.

10. The composition according to claim 1, wherein the polymer includes the structural unit having the crosslinkable group in a range of 0.1 mol % to 20 mol % with respect to a total of structural units constituting the polymer.

11. The composition according to claim 1, wherein the polymer includes the structural unit having the crosslinkable group in a range of 1 mol % to 15 mol % with respect to a total of structural units constituting the polymer.

12. The composition according to claim 1, wherein the polymer includes the structural unit having the crosslinkable group in a range of 3 mol % to 10 mol % with respect to a total of structural units constituting the polymer.

13. The composition according to claim 1, wherein the polymer includes the structural unit having the crosslinkable group in a range of 4 mol % to 8 mol % with respect to a total of structural units constituting the polymer.

14. The composition according to claim 1, wherein the base material surface has a first region and a second region such that the second region is substantially a non-metal.

15. The composition according to claim 14, wherein the polymer comprises the structural unit derived from styrene, the structural unit derived from t-butylstyrene, and the structural unit derived from methyl (meth)acrylate.

16. The composition according to claim 1, wherein the metal is a constituent of a metal substance, an alloy, an oxide, an electrically conductive nitride or a silicide.

17. The composition according to claim 16, wherein the polymer comprises the structural unit derived from styrene.

18. The composition according to claim 16, wherein a polystyrene equivalent number average molecular weight of the polymer is no less than 500 and no greater than 50,000.

19. The composition according to claim 16, wherein the first functional group is a sulfanyl group, an oxazoline ring-containing group, a phosphoric acid group, an epoxy group or a disulfide group.

20. The composition according to claim 16, wherein the polymer comprises, at one end of the main chain thereof, the group comprising the first functional group.

* * * * *